United States Patent
Cheng et al.

(10) Patent No.: US 10,996,006 B2
(45) Date of Patent: May 4, 2021

(54) CYCLING HEAT DISSIPATION MODULE

(71) Applicant: Acer Incorporated, New Taipei (TW)

(72) Inventors: Cheng-Yu Cheng, New Taipei (TW);
Wen-Neng Liao, New Taipei (TW);
Cheng-Wen Hsieh, New Taipei (TW)

(73) Assignee: Acer Incorporated, New Taipei (TW)

( * ) Notice: Subject to any disclaimer, the term of this patent is extended or adjusted under 35 U.S.C. 154(b) by 54 days.

(21) Appl. No.: 16/293,642

(22) Filed: Mar. 6, 2019

(65) Prior Publication Data

US 2019/0277584 A1 Sep. 12, 2019

(30) Foreign Application Priority Data

Mar. 7, 2018 (TW) .................................. 107107762

(51) Int. Cl.
| *F28D 15/00* | (2006.01) |
| *F28F 13/02* | (2006.01) |
| *H05K 7/20* | (2006.01) |

(52) U.S. Cl.
CPC ......... *F28F 13/02* (2013.01); *H05K 7/20309* (2013.01); *H05K 7/20318* (2013.01); *H05K 7/20327* (2013.01); *H05K 7/20409* (2013.01)

(58) Field of Classification Search
CPC . F28F 13/02; H05K 7/20309; H05K 7/20318; H05K 7/20327; H05K 7/20409
USPC .................................................... 165/104.26
See application file for complete search history.

(56) References Cited

U.S. PATENT DOCUMENTS

| 3,223,152 | A | * | 12/1965 | Schulenberg | F28B 1/06 |
| | | | | | 165/146 |
| 2014/0083126 | A1 | * | 3/2014 | Shimazu | F25B 41/06 |
| | | | | | 62/324.6 |
| 2017/0010049 | A1 | * | 1/2017 | Agostini | F28D 15/04 |
| 2018/0196337 | A1 | * | 7/2018 | Wang | G03B 21/14 |

FOREIGN PATENT DOCUMENTS

| CN | 2596307 | 12/2003 |
| CN | 1558448 | 12/2004 |
| CN | 1801483 | 7/2006 |
| CN | 101311662 | 11/2008 |
| CN | 101929816 | 12/2010 |
| CN | 102032822 | 4/2011 |
| CN | 203454874 | 2/2014 |
| CN | 103851939 | 6/2014 |
| JP | H03122451 | 5/1991 |
| JP | H0875384 | 3/1996 |
| JP | H08145585 | 6/1996 |
| JP | H09280783 | 10/1997 |

* cited by examiner

*Primary Examiner* — Davis D Hwu
(74) *Attorney, Agent, or Firm* — JCIPRNET

(57) ABSTRACT

A cycling heat dissipation module suited for dissipating heat generated from a heat source is provided. The cycling heat dissipation module includes an evaporator, a condenser, and a micro/nano-structure. The evaporator is thermal contacted with the heat source to absorb heat generated therefrom. The condenser is connected to the evaporator to form a loop, and a working fluid is filled in the loop. The working fluid in liquid state is transformed to vapor state by absorbing heat in the evaporator, and the working fluid in vapor state is transformed to liquid state by dissipating heat in the condenser. The micro/nano-structure is disposed in the condenser to destroy a boundary layer of the working fluid while passing through the condenser.

8 Claims, 4 Drawing Sheets

CYCLING HEAT DISSIPATION MODULE

CROSS-REFERENCE TO RELATED APPLICATION

This application claims the priority benefit of Taiwan application serial no. 107107762, filed on Mar. 7, 2018. The entirety of the above-mentioned patent application is hereby incorporated by reference herein and made a part of this specification.

BACKGROUND OF THE DISCLOSURE

Field of the Disclosure

The disclosure is related to a heat dissipation module, and particularly to a cycling heat dissipation module.

Description of Related Art

A heat-dissipating technology with two phases is developed by using latent heat conversion with transition of vapor-liquid phases to dissipate heat from electronic element. The basic principle of the technology uses the process that cooled liquid is evaporated into vapor when being heated through thermal contact with heat source in an evaporator, thereby dissipating a large amount of heat generated from the heat source. A force is generated by the vapor being formed continuously, such hat the vapor flows away from the evaporator. After being dissipated and cooled gradually, the vapor is condensed into liquid and returns back to the evaporator for the next heat-absorbing process.

In this manner, a cycle is formed with heat exchange (working fluid absorbs heat) in evaporator and heat exchange (working fluid dissipates heat) leaving evaporator, such that the working fluid can move smoothly between the planned evaporator and piping.

However, experiments of visualization of fluid show that, after being transformed into vapor and leaves the evaporator, the working fluid generates a slug flow phenomenon in the piping which causes a boundary layer formed on a wall of the piping. Therefore, heat exchange between the vapor and the tube wall is ineffective because of the boundary layer blocking between the vapor and the tube wall; as a result, the heat-dissipation efficiency of the cycle is reduced.

SUMMARY OF THE DISCLOSURE

The disclosure provides a cycling heat dissipation module, which uses a micro/nano structure to destroy a boundary layer generated by working fluid when travelling through condensing segment, thereby improving the heat exchange efficiency of working fluid at the condensing segment.

In the disclosure, the cycling heat dissipation module is configured to dissipate heat generated from heat source. The cycling heat dissipation module includes an evaporator, a condenser and a micro/nano-structure. The evaporator is thermal contacted with heat source to absorb the heat generated by the heat source. The condenser is connected to the evaporator to form a loop. The working fluid is filled in the loop. The working fluid in liquid state is transformed to vapor state by absorbing heat in the evaporator, and the working fluid in vapor state is transformed to liquid state by dissipating heat in the condenser. The micro/nano-structure is disposed on the condenser to destroy a boundary layer of the working fluid when travelling through the condenser.

In the disclosure, the cycling heat dissipation module is configured to dissipate heat generated from heat source. The cycling heat dissipation module includes an evaporator and a piping. The evaporator has a first outlet and a first inlet. The piping is connected to the first outlet and the first inlet of the evaporator to form a loop. The working fluid is filled in the loop. The working fluid in liquid state is transformed into vapor state by absorbing heat in the evaporator and flows out of the evaporator through the first outlet. The piping has a heat-blocking segment and a condensing segment, wherein the heat-blocking segment is disposed between the first outlet and the condensing segment, and the working fluid in vapor state is transformed into liquid state by dissipating heat at the condensing segment and flows into of the evaporator through the first inlet.

According to the above, by disposing the micro/nano-structure at the condensing segment, the cycling heat dissipation module is able to destroy the boundary layer formed by the working fluid in liquid-phase on the tube wall at the condensing segment when the working fluid passes through the condensing segment in the form of a mixed phase of liquid and vapor. In this manner, the working fluid in vapor-phase can dissipate heat smoothly through the tube wall, thereby achieving a better heat exchange efficiency. Furthermore, when the working fluid in liquid-phase is transformed into vapor-phase by absorbing heat in the evaporator and flows out of the evaporator to move toward the condensing segment, with the heat-blocking segment that is disposed between the outlet of the evaporator and the condensing segment in the piping, not only that it is possible to prevent the heat absorbed by the working fluid from affecting other surrounding elements in the area, but also a traveling force of the working fluid in vapor-phase can be maintained effectively, thereby ensuring that the working fluid can move smoothly in the loop through cycle.

In order to make the aforementioned features and advantages of the disclosure more comprehensible, embodiments accompanying figures are described in detail below.

DESCRIPTION OF EMBODIMENTS

Figure 1:
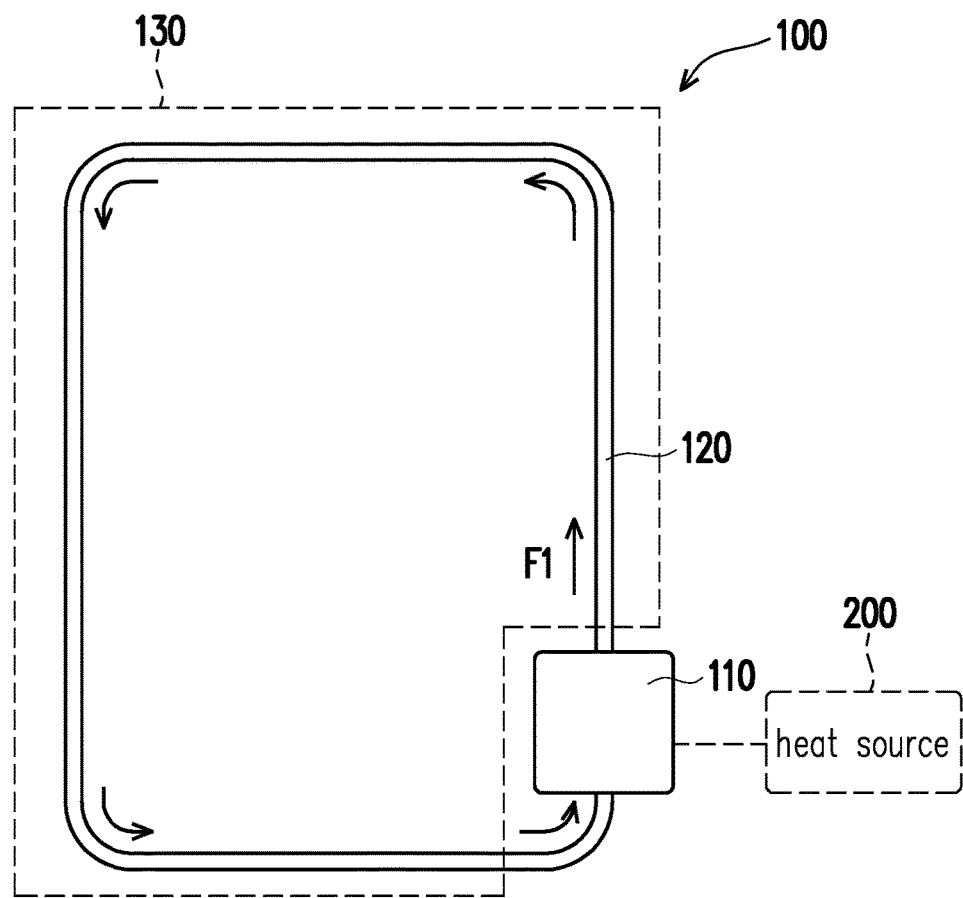
FIG. 1 is a schematic view of a cycling heat dissipation module according to an embodiment of the disclosure.
Figure 2:
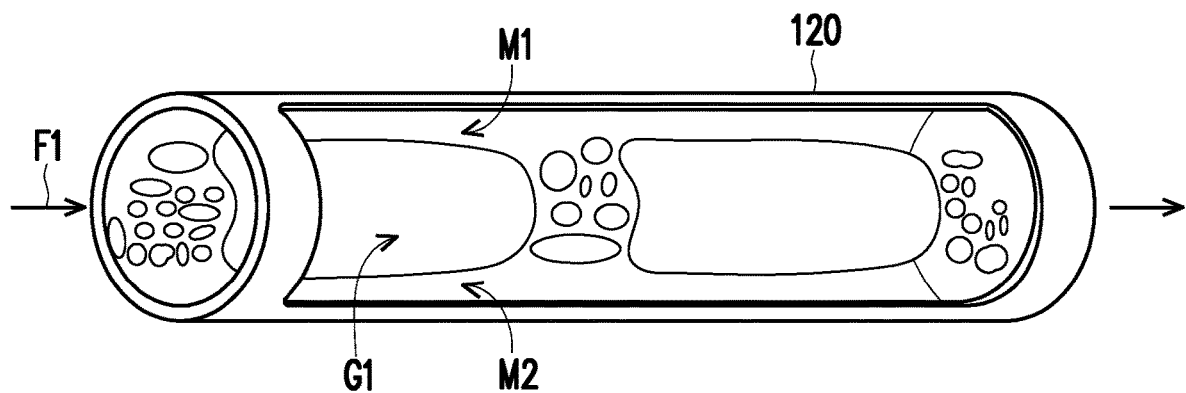
FIG. 2 shows working fluid in vapor-phase/liquid-phase status when travelling through condensing segment.

FIG. 1 is a schematic view of a cycling heat dissipation module according to an embodiment of the disclosure. FIG. 2 shows working fluid in vapor-phase/liquid-phase status when travelling through condensing segment. Referring to FIG. 1 and FIG. 2, in the embodiment, a cycling heat dissipation module 100 is configured to dissipate heat generated from a heat source 200, and the cycling heat dissipation module 100 includes an evaporator 110, a working fluid F1 and a condenser. The condenser includes a tube 120 and a heat-dissipating board 130 that abut upon each other in structure, wherein the tube 120 is connected to the evaporator 110 to form a loop such that the working fluid F1 is filled in the loop. With the configuration that the working fluid F1 is transformed between liquid-phase/vapor-phase by absorbing/dissipating heat, the effect of dissipating heat generated by the heat source can be achieved.

For example, in the interior of portable electronic device such as notebook computer or smart phone, due to increase of performance, it is inevitable that dissipating heat generated from electronic element becomes an issue to be solved. In this regard, according to the embodiment, the evaporator 110 and the heat source 200 (e.g., processor or display chip of electronic device) are thermal contacted with each other, and for example, through the configuration of heat pipe, the heat generated by the heat source 200 is transferred to the evaporator. Certainly, it is possible to directly abut the structure of the evaporator 110 upon the heat source 200 to directly absorb the heat generated therefrom. The disclosure provides no limitation to how the evaporator and the heat source are thermal contacted with each other.

In this manner, when travelling through the evaporator 110, the working fluid F1 in liquid-phase is able to be transformed into vapor-phase by absorbing heat, and moves toward the condenser from the evaporator 110. As described above, since the tube 120 and the heat-dissipating board 130 abut upon each other in structure, when the working fluid F1 in vapor-state travels through the tube 120, the working fluid F1 in vapor-state is gradually transformed into liquid-state because the heat is absorbed by the heat-dissipating board 130, and then returns to the evaporator 110 again along the tube 120 to complete a cycle. In the embodiment, only the heat-dissipating board 130 is exemplified as a structure for dissipating the heat of the working fluid F1, which should not be construed as a limitation to the disclosure. In other embodiments that are not shown, the heat-dissipating board 130 may be replaced by other existing related elements capable of achieving heat-dissipation effect such as a heat-dissipating fin, a housing of an electronic device capable of conducting heat, a fan and so on.

As shown in FIG. 2, along with the working fluid F1 that travels through the tube 120 and dissipates heat, there is working fluid F1 in vapor-phase (as bubble G1 shown in FIG. 2) and working fluid F1 in liquid-phase in the tube 120, and thus a slug flow is generated as the bubble G1 shown in FIG. 2. As a result, boundary layers M1 and M2 are formed between the working fluid F1 in liquid-phase and the wall of tube 120. The presence of the boundary layers M1 and M2 blocks the working fluid (bubble G1) in vapor-state from the tube wall, and causes the heat of the working fluid F1 in vapor-state unable to be continuously dissipated through the tube wall.

Accordingly, the embodiment further forms a micro/nano-structure on the wall of the tube 120 so as to destroy the boundary layers M1 and M2 described above, such that the working fluid F1 in vapor-phase is able to be in contact with the tube wall smoothly without being blocked, thereby achieving the heat-dissipation effect.

Figure 3A:
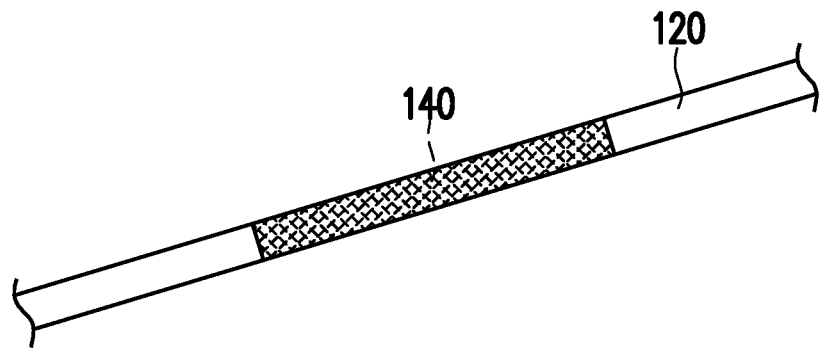
FIG. 3A is schematic view of a portion of a tube in FIG. 1.
Figure 3B:
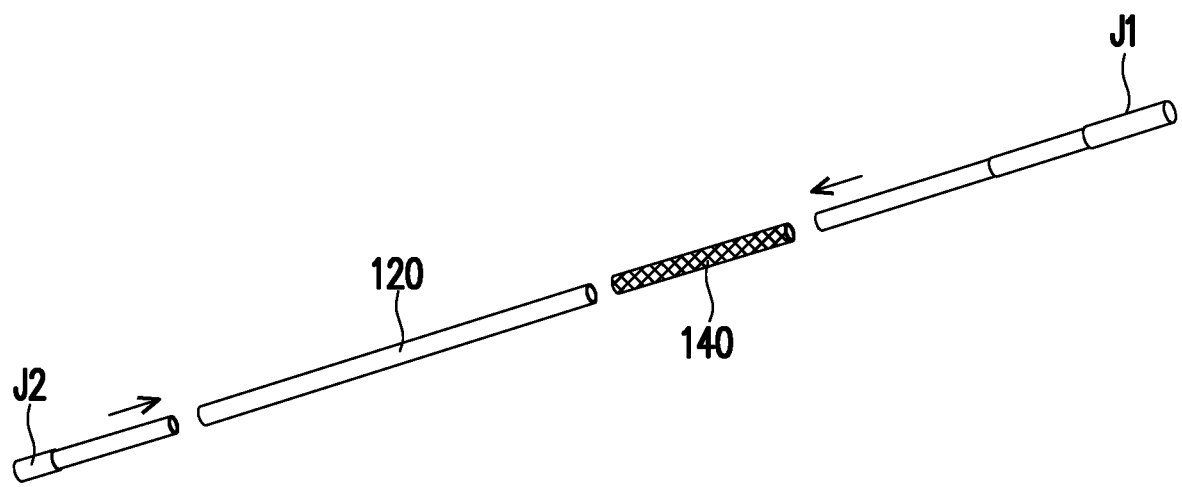
FIG. 3B is a schematic view showing fabrication of the portion of the tube in FIG. 3A.

Specifically, FIG. 3A is schematic view of a portion of the tube in FIG. 1. FIG. 3B is a schematic view showing fabrication of the portion of the tube in FIG. 3A. Referring to FIG. 3A and FIG. 3B and comparing them with FIG. 1, in the embodiment, a rough layer element 140 is combined with an inner wall of the tube 120 to complete the micro/nano-structure. As shown in FIG. 3B, the completed rough layer element 140 is inserted into the tube 120 through fixtures J1 and J2 which are driven relatively and positioned to the required position. Next, the tube 120 is partially deformed corresponding to two opposite ends of the rough layer element 140, such that the rough layer element 140 can be fixed within the tube 120 when the tube diameter is reduced. In this manner, the fixtures J1 and J2 can be removed smoothly and the combination of the rough layer element 140 and the tube 120 is completed. However, the disclosure provides no limitation to the above-mentioned means for combination. In another embodiment that is not shown, the micro/nano-structure may be, for example, formed integrally on a rough structure of the inner wall of the tube 120 through sintering process. It should be indicated that the disclosure provides no limitation to the range of the micro/nano-structure in the tube 120, the micro/nano-structure may be a portion of or the entire tube 120 shown in FIG. 1.

With such configuration, when the working fluid F1 travels through where the micro/nano-structure is present in the tube 120, the boundary layer generated by the working fluid F1 on the tube wall can be destroyed with such structure, such that the working fluid F1 in vapor-phase can dissipate heat through the tube wall. In the meantime, with such configuration, the heat exchange efficiency of working fluid F1 can be enhanced, and the travelling force required for the working fluid F1 to travel in the loop can be provided sufficiently.

Figure 4A:
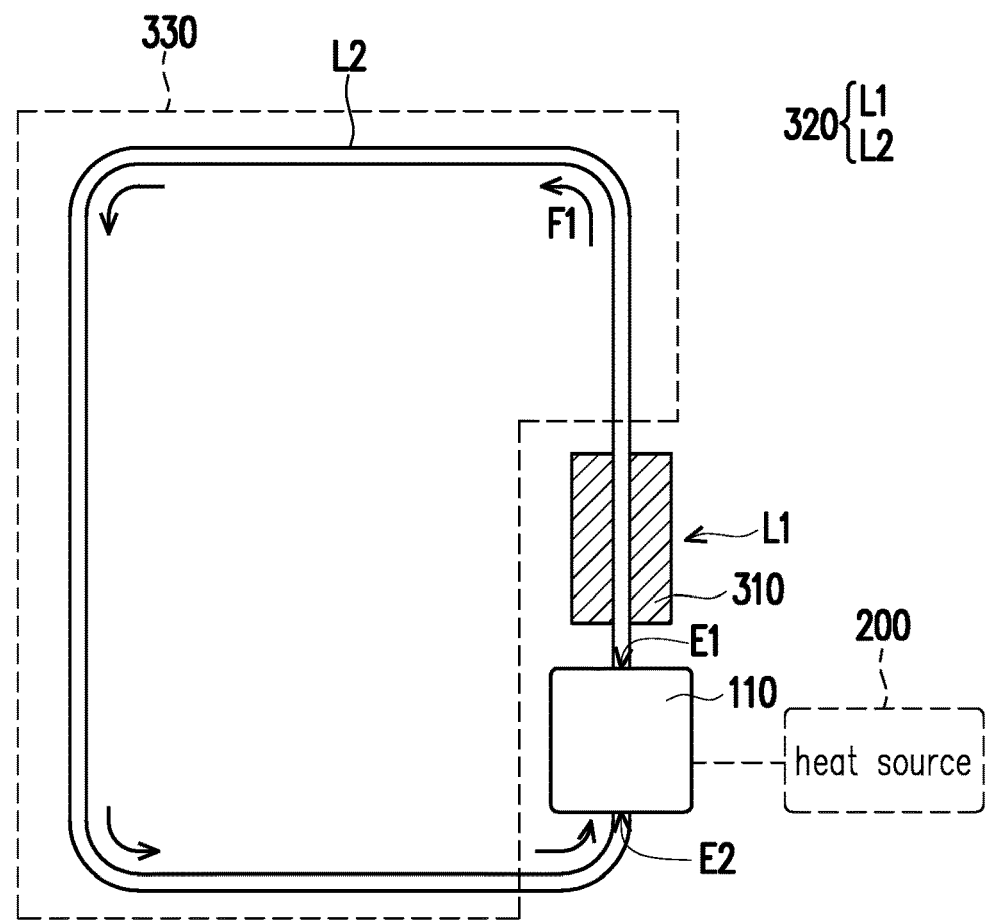
FIG. 4A is a schematic view of a cycling heat dissipation module according to another embodiment of the disclosure.

FIG. 4A is a schematic view of a cycling heat dissipation module according to another embodiment of the disclosure. Referring to FIG. 4A, in the embodiment, the cycling heat dissipation module includes the evaporator 110 and a piping 320, wherein the evaporator 110 is the same as described in the previous embodiment, and the piping 320 is further classified into a heat-blocking segment L1 and a condensing segment L2, wherein the heat-blocking segment L1 is connected between an outlet E1 of the evaporator 110 and the condensing segment L2, and the condensing segment L2 is connected between the heat-blocking segment L1 and an inlet E2 of the evaporator 110. Furthermore, the cycling heat dissipation module further includes a heat-blocking material 310 covering the heat-blocking segment L1. In this manner, with the presence of the heat-blocking material 310 at the heat-blocking segment L1, when the working fluid F1 that is transformed into vapor-state and flows from the evaporator 110 to the heat-blocking segment L1 of the piping 320, it can be avoided that the working fluid F1 dissipates heat through being in contact with a heat-blocking board 330 or other elements capable of dissipating heat, and thus the working fluid F1 can still maintain to be in vapor-state. Meanwhile, the travelling force of the working fluid F1 can be maintained accordingly, thereby avoiding loss of the traveling force of the working fluid F1 due to premature heat exchange. Additionally, such configuration also makes it possible to avoid that, when the elements in the electronic device are arranged closely (in a compacted manner), the heat of the working fluid F1 is likely to affect other elements at the heat-blocking segment L1, and results in loss of the heat from the working fluid F1, and it is also possible to avoid affecting the operation performance of other elements. Subsequently, when the working fluid F1 travels through the condensing segment L2, the heat-dissipating board 330 is used to perform the above-mentioned heat-dissipating operation.

Figure 4B:
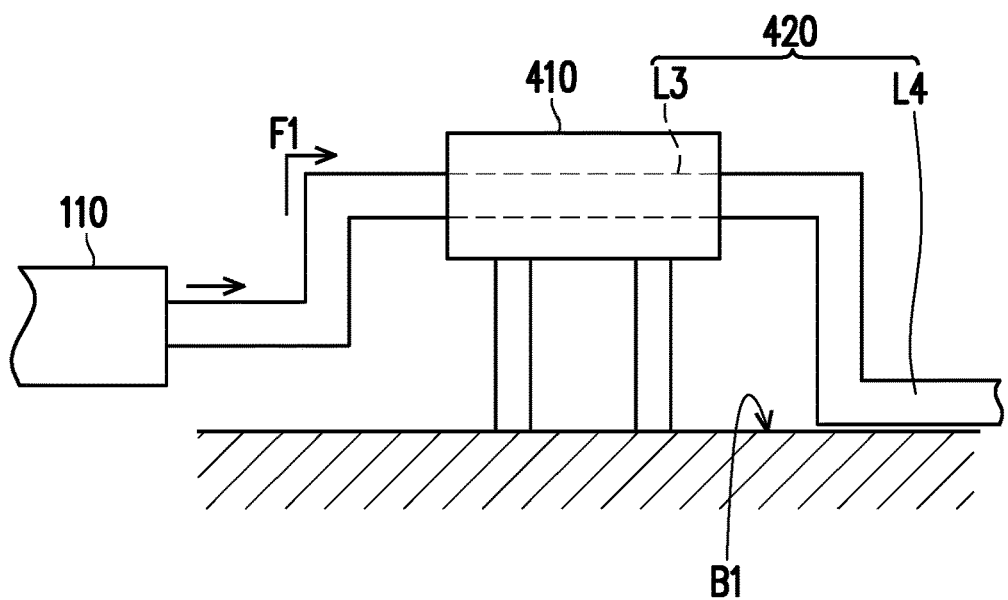
FIG. 4B is a schematic view of a portion of a cycling heat dissipation module according to yet another embodiment of the disclosure.

FIG. 4B is a schematic view of a portion of a cycling heat dissipation module according to yet another embodiment of the disclosure. It should be descried that the cycling heat dissipation module in the embodiment still has the connection relationship as shown in FIG. 4A. The difference between the embodiment and the previous embodiment is that a heat-blocking segment L3 is supported at a higher position as compared with a condensing segment L4 or the evaporator 110. Specifically, the embodiment uses a supporting structure 410 to support the heat-blocking segment L3 on a base B1 of the electronic device, thereby avoiding that the surrounding elements are affected by heat as described above. Also, it is possible to prevent the working fluid F1 from losing excessive heat when travelling through the heat-blocking segment L3 and thus losing travelling force for travelling through a piping 420 in the subsequent process.

Figure 5A:
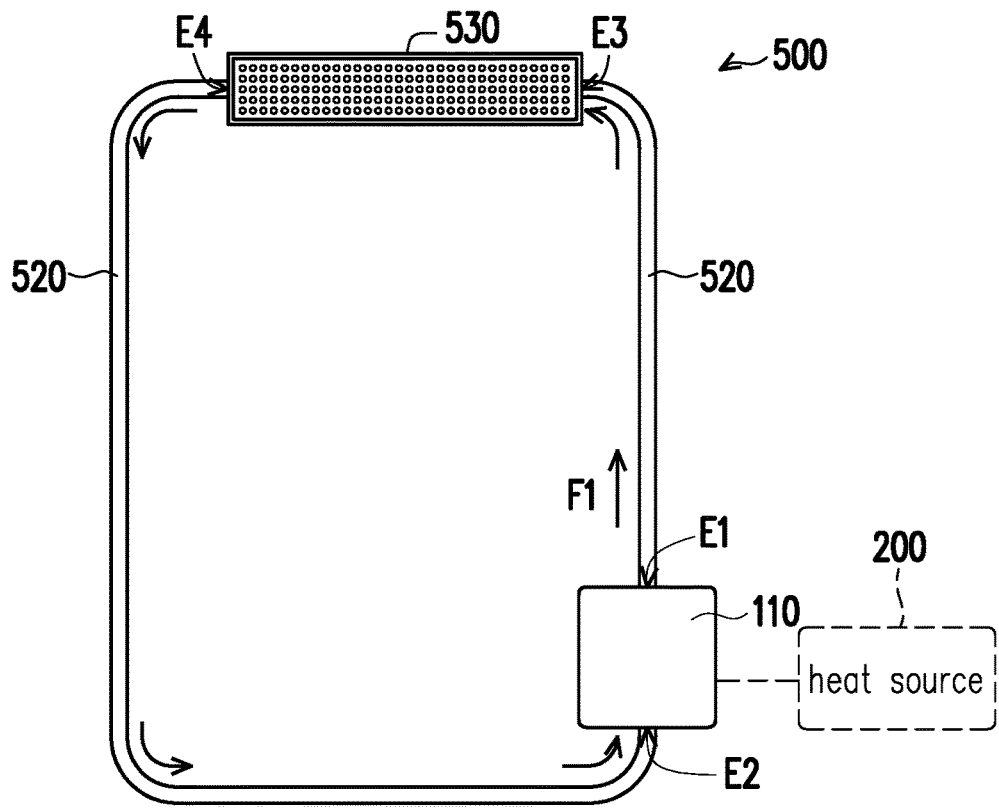
FIG. 5A is a schematic view of a cycling heat dissipation module according to still another embodiment of the disclosure.

FIG. 5A is a schematic view of a cycling heat dissipation module according to still another embodiment of the disclosure. Referring to FIG. 5A, in a cycling heat dissipation module 500 of the embodiment, the condenser includes a tube 520, a tank 530 and a micro/nano-structure disposed in the tank 530. As shown in FIG. 5A, the tube 520 is connected to the inlet E2 and the outlet E1 of the evaporator 110 as well as an inlet E3 and an outlet E4 of the tank 530. That is, the tank 530 may be regarded as a condensing segment disposed at the piping, or the tank 530 may be regarded as a condensing segment of the cycling heat dissipation module 500. Herein, the micro/nano-structure is a plurality of protrusions disposed in the tank 530 and arranged in arrays, such that the boundary layer between the working fluid F1 and the inner wall of the tank 530 can be destroyed due to the protrusions when the working fluid F1 flows into the tank 530. In this manner, the working fluid F1 in vapor-state is able to perform heat exchange (dissipate heat) in the tank 530 smoothly and transformed into liquid-state, and then flows into the evaporator 110 through the tube 520 and the inlet E2.

Figure 5B:
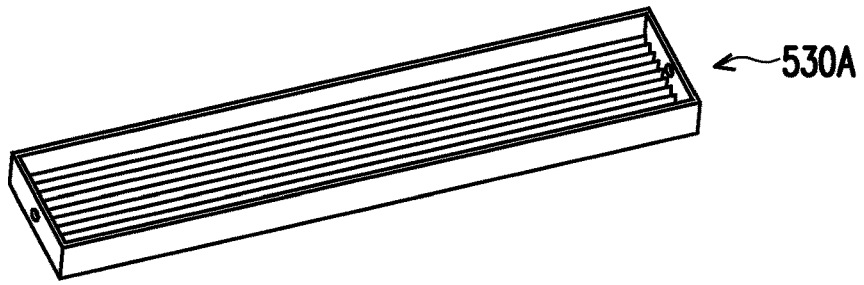
FIG. 5B and FIG. 5C are schematic views showing a portion of a cycling heat dissipation module according to different embodiments.
Figure 5C:
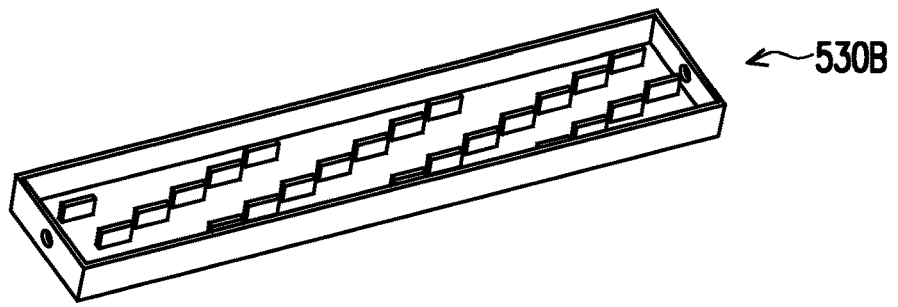

However, the disclosure provides no limitation to the shape of the micro/nano-structure in the tank. FIG. 5B and FIG. 5C are schematic views showing a portion of a cycling heat dissipation module according to different embodiments, and provided to show a different type of tank as compared with the tank 530 shown in FIG. 5A. In a tank 530A shown in FIG. 5B, a plurality of groove structures are disposed therein, whereas in a tank 530B shown in FIG. 5C, a plurality of fin structures arranged in specific direction are disposed therein. No matter what shape of the micro/nano-structure is, the micro/nano-structure is capable of achieving the effect of destroying the boundary layer generated by the working flow F1 when travelling through the tank. In other words, the micro/nano-structure in the disclosure may include at least one of a protrusion, a groove, a fin or an etching structure, thereby destroying the boundary layer between the working fluid and the inner wall of the piping such that the working fluid in vapor-phase is able to dissipate heat smoothly. In the other way around, a position in the piping of the cycling heat dissipation module where the micro/nano-structure is disposed may be regarded as a condenser or a condensing segment that transforms the working fluid F1 in vapor-phase into the working fluid F1 in liquid-phase.

In summary of the above, according to the embodiments of the disclosure, the cycling heat dissipation module disposes the micro/nano-structure at the condensing segment to destroy the boundary layer that is formed by the working fluid in liquid-phase on the tube wall at the condensing segment when the working fluid travels through the condensing segment in the mixed phase of liquid and vapor. In this manner, the working fluid in vapor-phase is able to dissipate heat smoothly through the tube wall, thereby achieving a better heat exchange efficiency. Furthermore, when the working fluid in liquid-phase is transformed into vapor-phase by absorbing heat in the evaporator, and moves toward the condensing segment after being transferred out of the evaporator, by disposing the heat-blocking segment between the outlet of the evaporator and the condensing segment in the piping, not only that it is possible to prevent the heat absorbed by the working fluid from affecting other surrounding elements in the area, but also the traveling force of the working fluid in vapor-phase can be maintained effectively, thereby ensuring that the working fluid can move smoothly in the loop through cycle.

Moreover, the micro/nano-structure may be a rough structure or a rough layer element in the inner wall of tube, and a tank may be disposed on a portion of the piping, and at least one of the protrusion, groove, fin or etching structure may be formed in the tank, such that the piping with uneven surface can achieve the purpose of destroying the boundary layer of the working fluid.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A cycling heat dissipation module, configured to dissipate heat generated from a heat source, the cycling heat dissipation module comprising:
   an evaporator, thermal contacted with the heat source to absorb heat generated by the heat source;
   a condenser, connected to the evaporator to form a loop, a working fluid filled in the loop, wherein the working fluid in liquid-state is transformed into vapor-state by absorbing heat in the evaporator, and the working fluid in vapor-state is transformed into liquid-state by dissipating heat in the condenser; and
   a micro/nano-structure, disposed on an inner wall in the condenser to destroy a boundary layer formed by the working fluid when travelling through the condenser.

2. The cycling heat dissipation module according to claim 1, wherein the working fluid generates a slug flow in the condenser due to presence of vapor and liquid phases, and the boundary layer is formed between the working fluid and the condenser.

3. The cycling heat dissipation module according to claim 1, wherein the condenser comprises a tube connected to the evaporator to form the loop, and the micro/nano-structure is a rough structure formed on the inner wall of the tube.

4. The cycling heat dissipation module according to claim 1, wherein the condenser comprises a tube connected to the evaporator to form the loop, and the micro/nano-structure is a rough layer element combined with the inner wall of the tube.

5. The cycling heat dissipation module according to claim 1, further comprising:
   a tube, connected to the evaporator to form the loop, wherein the condenser comprises a tank connected between a portion of the tube, and the micro/nano-structure is disposed in the tank.

6. The cycling heat dissipation module according to claim 5, wherein the micro/nano-structure is at least one of a protrusion, a groove, a fin or an etching structure disposed in the tank.

7. The cycling heat dissipation module according to claim 1, further comprising:
  a heat-blocking segment, connected between the condenser and the evaporator; and
  a heat-blocking material, covering the heat-blocking segment.

8. The cycling heat dissipation module according to claim 7, wherein the heat-blocking segment is supported at a higher position relative to the condenser or the evaporator.

* * * * *